US006857627B2

(12) United States Patent
Gordon

(10) Patent No.: US 6,857,627 B2
(45) Date of Patent: Feb. 22, 2005

(54) INFLATABLE BLADDER WITH SUCTION FOR SUPPORTING CIRCUIT BOARD ASSEMBLY PROCESSING

(75) Inventor: Brian F. Gordon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 10/000,510

(22) Filed: Oct. 23, 2001

(65) Prior Publication Data

US 2003/0074788 A1 Apr. 24, 2003

(51) Int. Cl.[7] .................................................. B25B 1/00
(52) U.S. Cl. ........................................ 269/21; 29/559
(58) Field of Search ............................ 269/21, 20, 32, 269/269, 903, 266; 254/93 H, 89 H; 92/90, 93, 94, 96

(56) References Cited

U.S. PATENT DOCUMENTS

| | | | | |
|---|---|---|---|---|
| 5,092,510 A | | 3/1992 | Anstrom et al. | ............... 228/55 |
| 5,820,117 A | * | 10/1998 | Thompson et al. | ............ 269/22 |
| 5,906,364 A | * | 5/1999 | Thompson et al. | ............ 269/22 |
| 6,189,876 B1 | * | 2/2001 | Frazier | ......................... 269/21 |
| 6,272,989 B1 | * | 8/2001 | Misono et al. | ............... 101/474 |
| 6,318,433 B1 | * | 11/2001 | Reis et al. | ................... 156/382 |
| 6,658,718 B2 | * | 12/2003 | Farnworth et al. | ............ 29/559 |

* cited by examiner

Primary Examiner—Lee D. Wilson
(74) Attorney, Agent, or Firm—Whyte Hirschboeck Dudek SC

(57) ABSTRACT

An inflatable bladder comprising at least one aperture and/or at least one baffle within the bladder for supporting a printed circuit board during component placement on a semiconductor substrate such as a printed circuit board is provided. The inflatable bladder is positioned to provide support for the substrate while apertures within the inflatable bladder communicate a suction force to the substrate to inhibit the substrate from bending, bowing, or flexing away from contact with the inflatable bladder during component placement. The inflatable bladder provides support for the substrate while attempting to prevent injury to components by pliably conforming to component irregularities on the back side of the substrate. The inflatable bladder can be selectively inflated or deflated for contacting the substrate and thereafter supporting the back side of the substrate during assembly operations. Alternatively, a lift table can be selectively raised or lowered for placing the inflatable bladder in contact with the back side of the substrate during assembly operations. The inflatable bladder can contain one or more baffles to define one or more compartments within the inflatable bladder. The inflatable bladder can be incorporated into a typical system for component assembly comprising a pair of rails, each having a slot therein, for receiving a substrate.

80 Claims, 7 Drawing Sheets

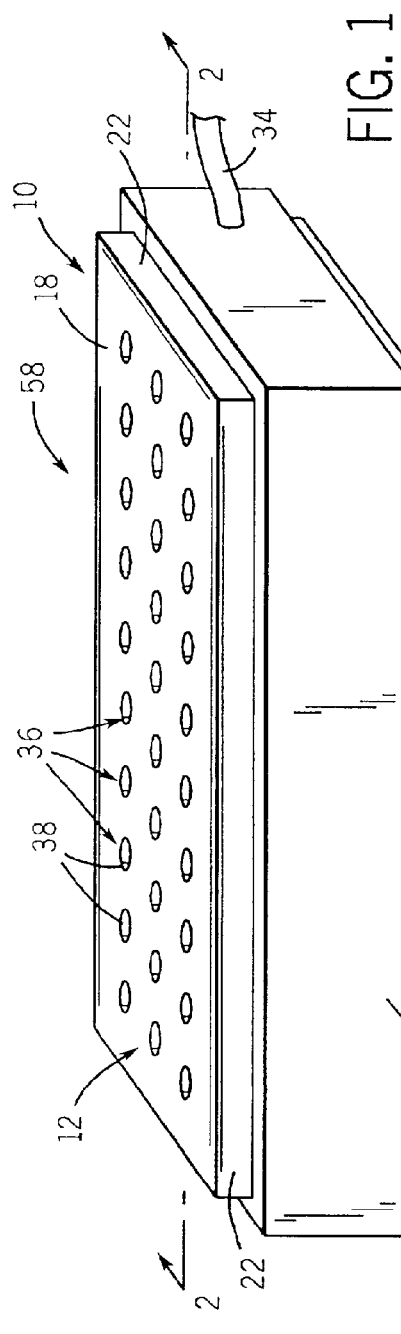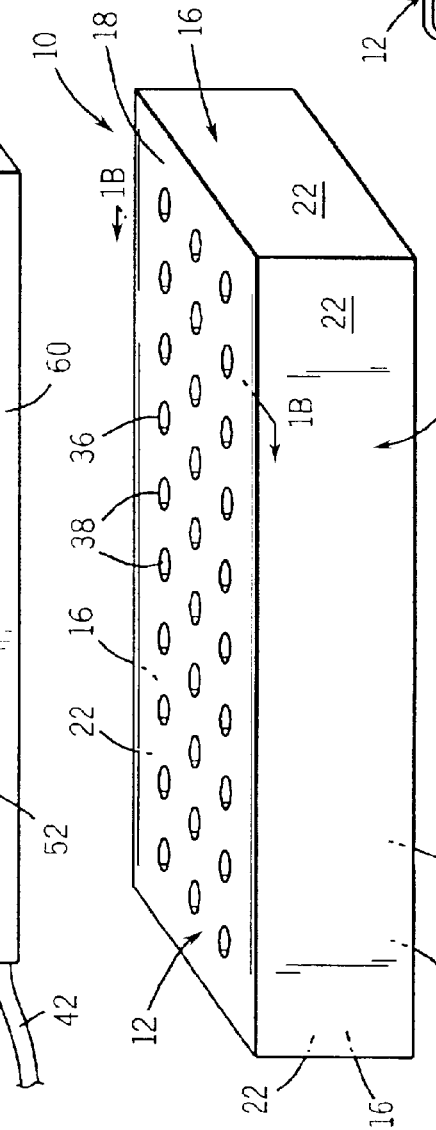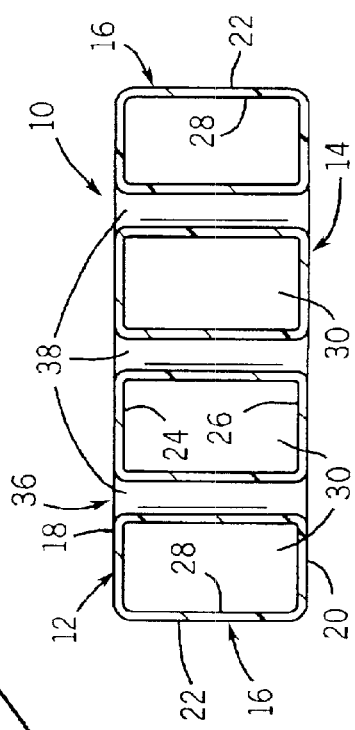

INFLATABLE BLADDER WITH SUCTION FOR SUPPORTING CIRCUIT BOARD ASSEMBLY PROCESSING

FIELD OF THE INVENTION

This invention relates in general to semiconductor device assembly processing and, more particularly, to an inflatable bladder for supporting and securing a semiconductor substrate during a component placement process.

BACKGROUND OF THE INVENTION

Various techniques have been developed for the automated mounting of electronic components to printed circuit boards (PCB's). During mounting, substantial forces can be exerted on the PCB by the automated placement head. Accordingly, assembly processing requires back side support of a chosen substrate, such as a circuit board, capable of withstanding such forces. The back side support should provide good, solid support for allowing even and accurate placement of components on the top side of the substrate. Good support is needed where fine-pitched component leads are being placed. The support, however, should also avoid damaging components on the back side of the PCB where a double-sided board is used. Further, evenly distributed support under the placement area assists in avoiding the cracking of solder joints or the breaking of component leads from existing solder joints. This result can occur to previously placed components on the back side of the board, as components on the top side of the board are affixed, if the support is not proper.

One apparatus and method for supporting the back side of a PCB is disclosed in U.S. Pat. No. 5,820,117 (Thompson, et. al.). Here, an air bladder fixture tooling for supporting circuit board assembly processing is detailed. The bladder is positioned below the circuit board within a containment unit adapted for use with conventional railed assembly equipment. While the air bladder may provide uniform back side support, the PCB is not dissuaded from moving, bulging, bending or bowing away from contact with the bladder, especially at those locations distant from the slotted, opposing rails. Therefore, the PCB does not remain in contact with the bladder during component head placement.

Further, the bladder in Thompson is limited to a sole air compartment or chamber. Thus, it can be expected that some portions of the bladder, especially those furthest from the side walls, will "balloon" as the air bladder is inflated. As a result, the support provided by the air bladder furthest from the side walls can be greater than the support provided proximate the side walls of the bladder. Among other drawbacks, support provided by the bladder can be uneven and cause injury to the PCB or components. Also, with a sole chamber, Thompson is limited to a single internal pressure within the air bladder.

Given these limitations of the prior art, there is a clear need for an improved PCB support apparatus and method that overcomes such problems.

SUMMARY OF THE INVENTION

In one aspect, the invention provides an inflatable bladder for supporting a semiconductor substrate.

In one embodiment, the inflatable bladder comprises at least one aperture disposed within the bladder extending from the top exterior surface to the bottom exterior surface of the bladder. In a further embodiment of the inflatable bladder, the inflatable bladder comprises a plurality of apertures disposed within the inflatable bladder and extending from the top exterior surface to the bottom exterior surface. The bladder can further comprise a member for introducing a suction force into the aperture(s), whereby the suction force urges a substrate into contact with the bladder.

In another embodiment, the inflatable bladder further comprises side walls that are pleated or corrugated. In yet another embodiment, the aperture(s) disposed within the inflatable bladder comprise aperture side walls that are pleated or corrugated.

In another embodiment, the inflatable bladder comprises at least one baffle disposed within the inflatable bladder. In further embodiments, the inflatable bladder is secured within the bladder to the top interior surface and bottom interior surface, to the top interior surface and one of the side wall interior surfaces, to the top interior surface and more than one of the side wall interior surfaces, or to the top interior surface, the bottom interior surface, and at least one of the side wall interior surfaces.

In another embodiment, the bladder comprises at least one aperture, a member for introducing a suction force into the aperture(s), and at least one baffle as described above. In other embodiments, the suction introducing member translates the suction force to the aperture(s) to inhibit a semiconductor substrate that is disposed upon the bladder from flexing, bowing, or bending away from contact with the top exterior surface of the inflatable bladder. In still other embodiments, the suction force urges the semiconductor substrate into contact with the inflatable bladder to inhibit the semiconductor substrate from flexing, bowing, or bending away from contact with the top exterior surface of the inflatable bladder. In further embodiments, the side walls of the aperture(s) longitudinally compress. In still further embodiments, the baffle(s) within the bladder are secured within the bladder as described above to inhibit a semiconductor substrate disposed upon the bladder from flexing, bowing, or bending away from contact with the top exterior surface of the inflatable bladder.

In another aspect, the invention provides a fixture apparatus. In one embodiment, the fixture apparatus comprises an inflatable bladder comprising at least one aperture disposed within the inflatable bladder and extending from the top exterior surface to the bottom exterior surface, a member for introducing a suction force into the aperture(s), and a containment structure for retaining the inflatable bladder therein. In yet another embodiment, the fixture apparatus comprises a containment structure comprising a flange and a lip for engaging the flange to secure a portion of the inflatable bladder within the containment structure. In still another embodiment, the fixture apparatus comprises a containment structure that includes a cover plate for selectively covering a portion of the inflatable bladder and reducing the top exterior surface of the inflatable bladder that contacts the semiconductor substrate.

In another embodiment, the inflatable bladder of the fixture apparatus further comprises at least one baffle disposed within the inflatable bladder. In still further embodiments, the inflatable bladder of the fixture apparatus comprises both one or more apertures and one or more baffles. In still another embodiment, the fixture apparatus is associated with a pair of rails, each rail having a slot formed therein and each of the slots configured to receive an opposing edge of a semiconductor substrate. The opposing edges of the semiconductor substrate are slidably supported in the slots of the rails during placement of components on the semiconductor substrate.

In another aspect, the invention provides a system for placing components on a semiconductor substrate. In one embodiment, the system comprises a fixture apparatus comprising an inflatable bladder with at least one aperture disposed therein, a containment structure for retaining the bladder therein, a member for introducing a suction force into the at least one aperture, a pair of rails containing slots for receiving opposing edges of a semiconductor substrate, a base plate for providing vertical movement or translation of the fixture apparatus, and a placement head for placing components onto the semiconductor substrate. In another embodiment of the system, the inflatable bladder can also comprise at least one baffle within the bladder.

In another aspect, the invention provides a method of supporting a semiconductor substrate. In one embodiment, the method comprises providing an inflatable bladder that comprises at least one aperture and, optionally, at least one baffle disposed therein, positioning the semiconductor substrate proximate the top exterior surface of the inflatable bladder, and introducing a suction force into the aperture(s) of the bladder to secure the semiconductor substrate to the top exterior surface of the inflatable bladder. In another embodiment, the method further comprises positioning the semiconductor substrate in slots located within a pair of rails, the slots being positioned on either side of the bladder, such that the semiconductor substrate is proximate the top exterior surface of the inflatable bladder.

In another embodiment, the method further comprises preventing the semiconductor substrate from bending, bowing, or flexing away from contact with the inflatable bladder during component placement. In yet another embodiment, the method further comprises expelling the supply of fluid from the inflatable bladder such that the inflatable bladder deflates, and thereafter, transporting the semiconductor substrate to a subsequent step in the semiconductor assembly process. The method can also comprise adjusting the suction force introduced into the aperture(s) to permit the suction pressure to be increased or decreased. Further, the method may include segregating the cavity within the inflatable bladder using the baffle(s) and thereby creating separate chambers within the inflatable bladder. By incorporating an aperture, check valve, or like device into the baffle(s), the baffle(s) can permit distribution of the suction force within the chambers such that the suction force in the chambers is approximately equal.

BRIEF DESCRIPTION OF THE DRAWINGS

Embodiments of the invention are described below with reference to the following accompanying drawings, which are for illustrative purposes only. The invention is not limited in its application to the details of construction or the arrangement of the components set forth in the following description or illustrated in the drawings. The invention is capable of other embodiments or of being practiced or carried out in other various ways. Also, it is to be understood that the terminology and phraseology employed herein is for purpose of description and illustration and should not be regarded as limiting. Like reference numerals are used to indicate like components.

FIG. 1 is a perspective view of an embodiment of a fixture apparatus according to the invention illustrating an inflatable bladder mounted in a containment structure and possessing an external suction gallery.

FIG. 1A is a perspective view of the inflatable bladder of the fixture apparatus of FIG. 1 without a containment structure or external gallery.

FIG. 1B is a cross-sectional, side elevational view of the inflatable bladder depicted in FIG. 1A taken along line 1B—1B illustrating the walls and surfaces of the inflatable bladder.

DETAILED DESCRIPTION OF THE PREFERRED EMBODIMENT

Figure 2:
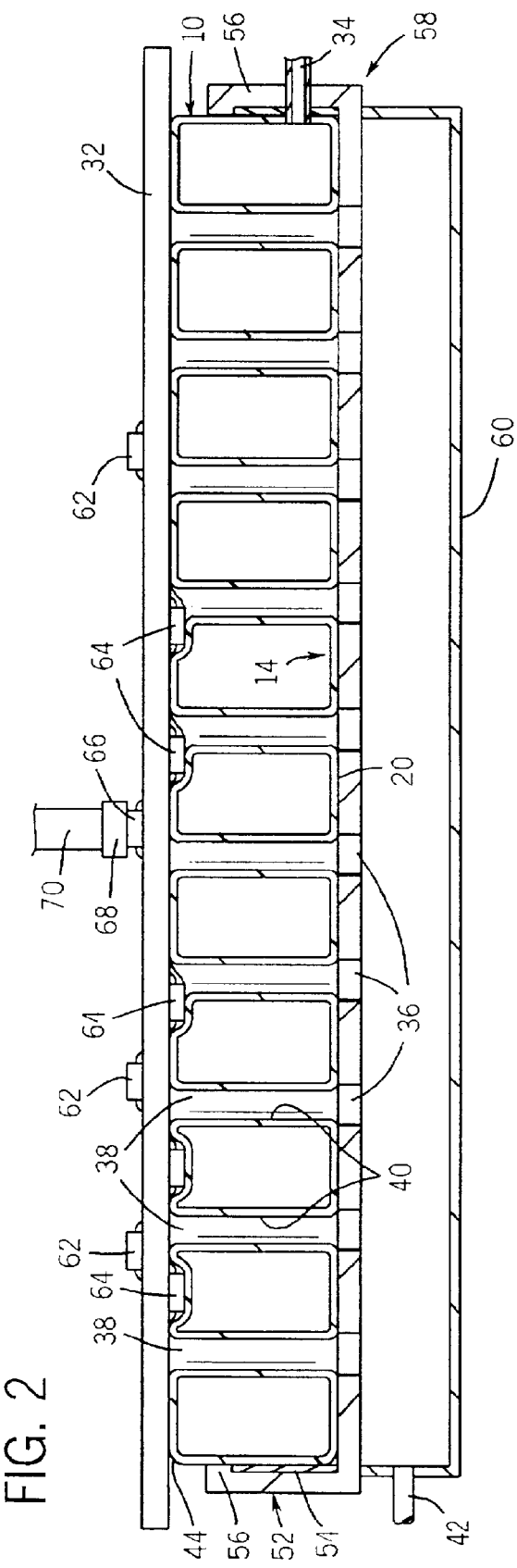
FIG. 2 is an elevational view of the fixture apparatus depicted in FIG. 1, taken along line 2—2, illustrating the inflatable bladder mounted in a containment structure as the inflatable bladder supports a semiconductor substrate during a component placement process.

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

While a substrate can include a plurality of conventional semiconductor substrates known in the microelectronics or semiconductor industry, as an illustrative example only, a semiconductor substrate known as a printed circuit board (PCB) will be used to further describe the invention.

Referring to FIGS. 1, 1A, and 1B, inflatable bladder 10 comprises a top wall 12, a bottom wall 14, and side walls 16. The top wall 12, bottom wall 14, and side walls 16 define a top exterior surface 18, a bottom exterior surface 20, and side wall exterior surfaces 22, respectively, that are the external surfaces of inflatable bladder 10. The top wall 12, bottom wall 14, and side walls 16 further define a top interior surface 24, a bottom interior surface 26, and side wall interior surfaces 28, respectively, that are disposed within inflatable bladder 10 and oppose complimenting exterior surfaces. The interior surfaces, in combination, define a cavity 30 within inflatable bladder 10. When a PCB 32 is positioned onto inflatable bladder 10, the top wall 12, and specifically the top exterior surface 18, of inflatable bladder 10 support the PCB 32. The top wall 12 of inflatable bladder 10 should be pliable and sufficiently accepting of components that may be disposed on the PCB and come into contact with top wall 12.

Figure 5:
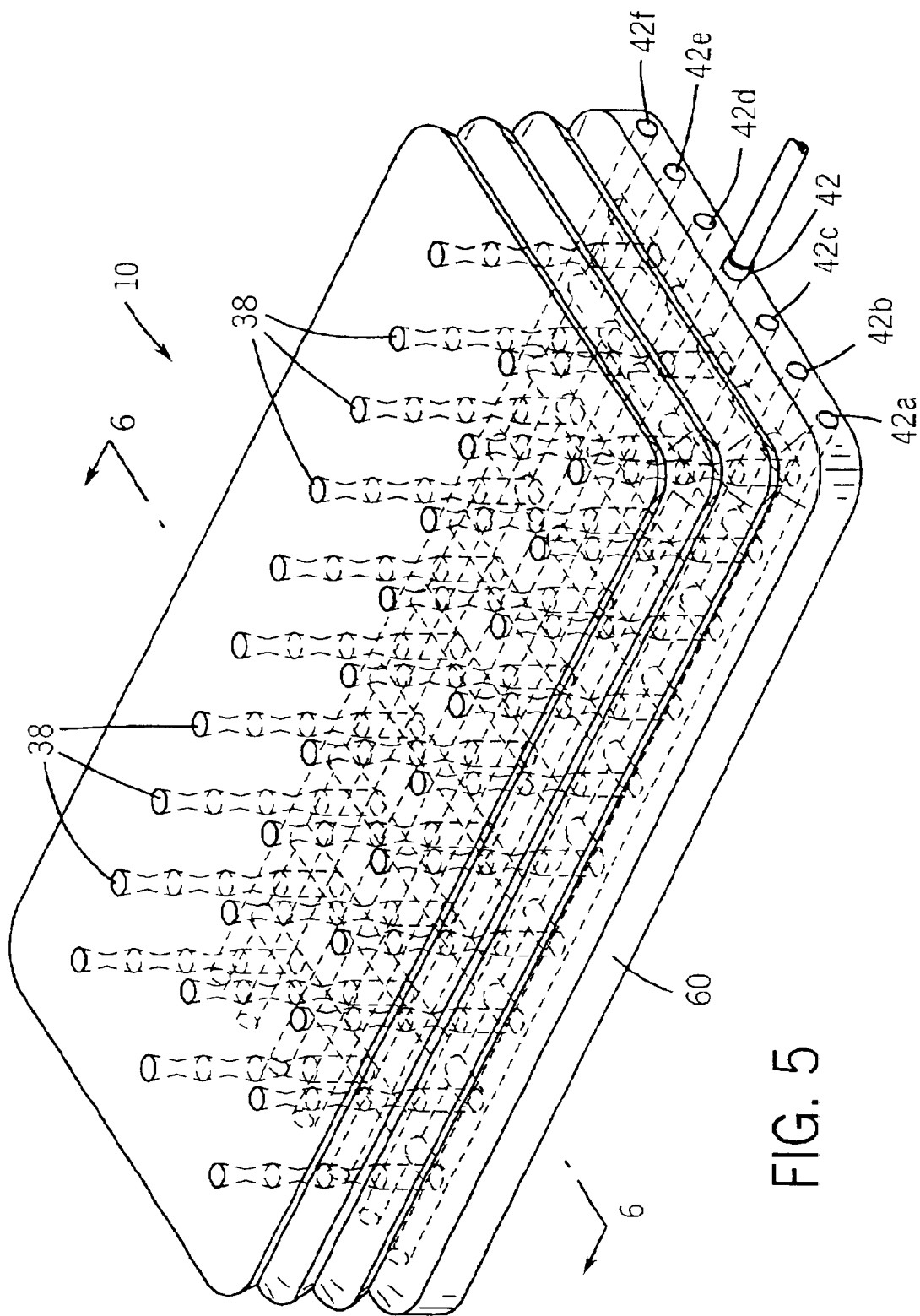
FIG. 5 is a perspective view of another embodiment of an inflatable bladder comprising pleated side walls, as well as apertures and a suction gallery internal to the inflatable bladder.

The cavity 30 within inflatable bladder 10 permits inflatable bladder to receive and contain fluids. Thus, inflatable bladder 10 further comprises supply tube 34 for introducing a fluid into the cavity 30 to inflate inflatable bladder 10. Supply tube 34 can be mounted to inflatable bladder 10 in various locales, such as a side wall, as shown in FIGS. 2 and 5, or bottom wall 14 of inflatable bladder 10 (not shown). Supply tube 34 permits inflatable bladder 10 to be selectively inflated and deflated as desired for supporting a semiconductor substrate. Inflation of inflatable bladder 10 can be accomplished using a variety of fluids, including a gas or liquid. Examples of suitable gases include air, oxygen, and nitrogen. Examples of suitable liquids include water and oil. Although a fluid is supplied by supply tube 34, other means such as hoses, pipes, conduits, channels, ducts, or the like are contemplated as suitable alternatives for providing fluid therethrough to the bladder.

At least the top wall 12 of inflatable bladder 10 is comprised of a pliable material for receiving components 62, 64 disposed on the surface of PCB 32. For example, the walls of the inflatable bladder can comprise a vulcanized rubber, a polyurethane material, or a coated fabric such as vinyl. Further, the walls of inflatable bladder 10 can be comprised of materials adapted to provide proper electrostatic discharge safety features, for example a carbon impregnated vinyl. Likewise, inflatable bladder 10 can be contained within such materials, or portions of such materials can be secured to the exterior surfaces of the inflatable bladder. Notably, the top wall 12, the bottom wall 14, or side walls 16 of inflatable bladder 10 can comprise several layers of material. In another embodiment, the walls of inflatable bladder 10 have a thickness of about 0.03 to about 0.05 of an inch (about 0.76 to about 1.26 mm). The thickness of the walls permits inflatable bladder 10 to conform to irregularities existing due to components 62, 64 on a PCB 32 and still render support as components 62, 64 are placed on the top exterior surface 18. The thickness of the walls of inflatable bladder can also be dictated by the physical properties of the material, such as pliability, strength, and conformance. While a variety of fluid pressures within inflatable bladder 10 are contemplated, the pressure should adequately permit inflatable bladder 10 to conform to irregularities of a wide range of components 62, 64 placed on the PCB 32. For example, the inflatable bladder can be inflated with a gas, namely air, to achieve approximately 2 to 30 pounds per square inch of pressure.

Figure 3:
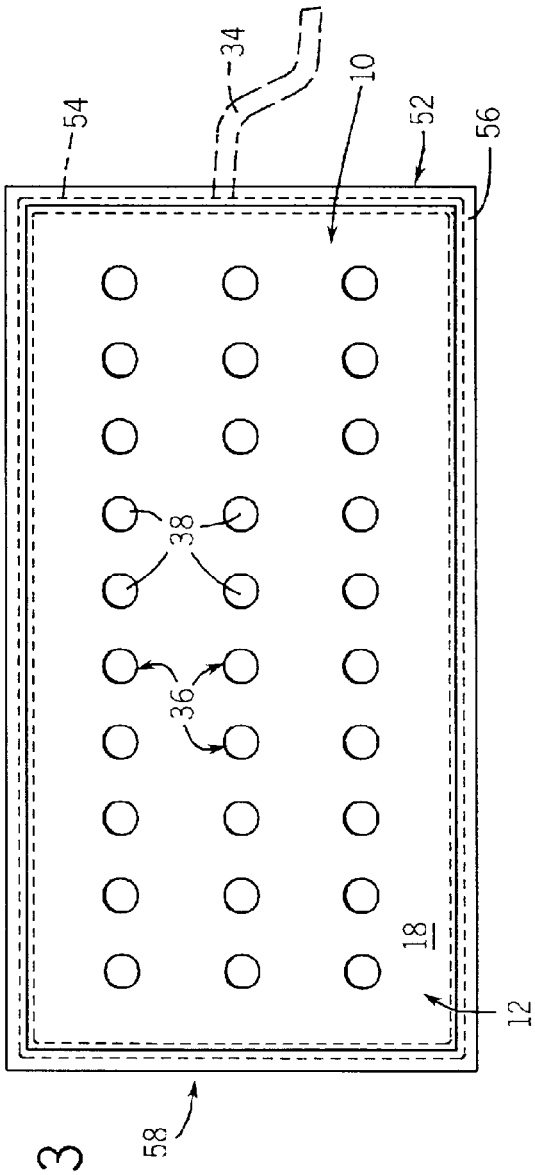
FIG. 3 is a top plan view of the fixture apparatus of FIG. 1, illustrating the inflatable bladder mounted in a containment structure.

Inflatable bladder 10 has a peripheral dimension that defines side walls 16. The side walls can permit inflatable bladder 10 to take a variety of geometric shapes when observing the inflatable bladder from a top plan view. Such a top plan view is illustrated in FIG. 3. Inflatable bladder 10 can be substantially coextensive with the peripheral dimensions of an overlying PCB 32.

Referring to FIGS. 1 through 6, a plurality of apertures 36 have been incorporated into inflatable bladder 10. Apertures are generally disposed within inflatable bladder 10 and extend from, and through, the top exterior surface 18 to the bottom exterior surface 20 of the inflatable bladder. Thus, the apertures define a pair of distal aperture openings 38, one opening typically being disposed on the top exterior surface 18 and the other opening being disposed on the bottom exterior surface 20. The apertures are defined by aperture side walls 40, the side walls extending from the top exterior surface 18 to the bottom exterior surface 20 of inflatable bladder. The apertures comprise aperture openings 38 that allow communication of a suction force, otherwise described as suction pressure, negative force, or vacuum force, from a suction tube 42 to the opening 38 of each aperture at the top exterior surface 18 of inflatable bladder 10. The apparatus or means for creating the suction force can be a vacuum device or any other means known in the art for creating a negative, or suction, pressure.

One aperture, or multiple apertures 36, can be incorporated into inflatable bladder 10 and, as illustrated in FIGS. 1, 3, and 5, a plurality of apertures 36 has been provided. Apertures with individual characteristics and in various configurations can be employed. The plurality of apertures 36 can comprise a distinct symmetrical pattern of individual apertures equally spaced from each other across inflatable bladder 10 at either the top exterior surface 18 or bottom exterior surface 20. Likewise, each aperture can be of equal size and shape with respect to other apertures. However, it is also contemplated that each aperture in the plurality of apertures 36 can be arrayed or grouped in any fashion, can be random, or can otherwise be dissimilar. Each aperture can have a constant or variable axial cross section. Likewise, each aperture can have aperture side walls 40 of a variable, longitudinal lengths, depending on the depth of the inflatable bladder at the respective locale or the expansion of an aperture. Each aperture can have an axial cross section at either the top exterior surface 18 or the bottom exterior surface 20, or somewhere in between, that is round, square, rectangular, polygonal, or irregular polygonal. As such, the diameter of an aperture, or the distance between aperture side walls 40, can vary in a sole aperture or among several apertures. Further, while the apertures are depicted as having a longitudinal axis perpendicular to the top or bottom wall 12,14 of inflatable bladder 10, this is not required and the apertures can be angled or tilted.

Figure 12:
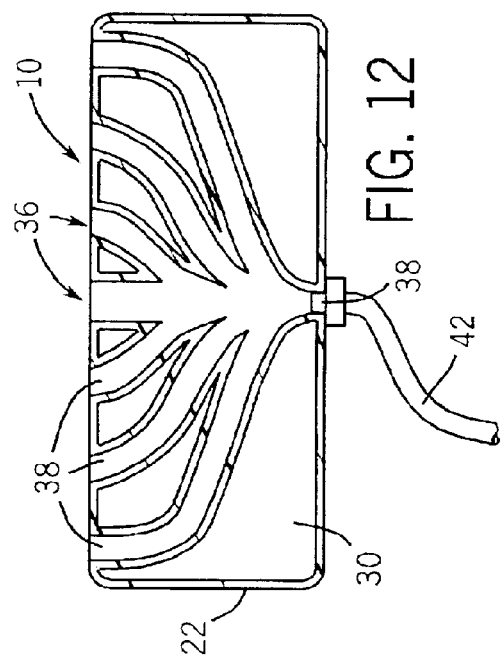
FIG. 12 is a cross-sectional, side elevational view of another embodiment of an inflatable bladder of the invention with converging apertures disposed within the inflatable bladder.
Figure 8:
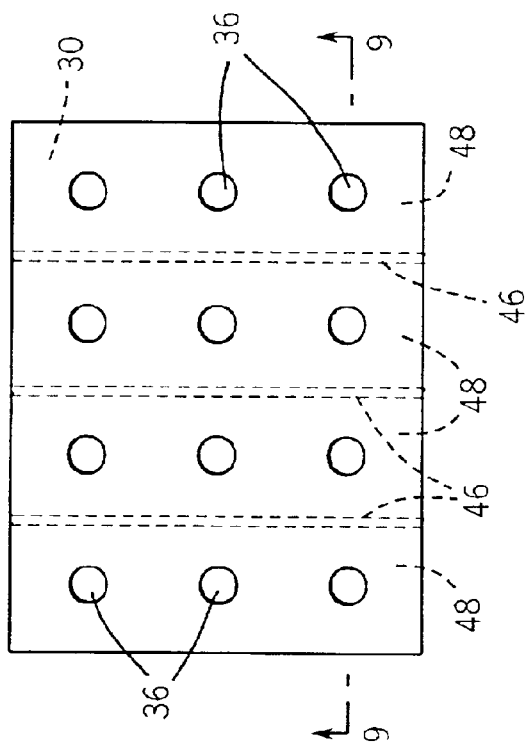
FIG. 8 is a top plan view of the inflatable bladder of FIG. 7 further illustrating the apertures and baffles within the bladder.

Additionally, two or more apertures can converge within inflatable bladder 10, at the top exterior surface 18, or at the bottom exterior surface 20, as depicted in FIG. 12. In such cases, a plurality of aperture openings 38 is found at one exterior surface of inflatable bladder 10, while as few as one aperture opening is found at the other exterior surface.

The side walls 40 of each aperture in the plurality of apertures 36 can comprise the same or a different material as the walls of inflatable bladder 10. The side walls 40 of apertures are integrally formed with inflatable bladder 10. Alternatively, each side wall 40 of an aperture can comprise its own distinct material and even be formed separately from inflatable bladder 10. Depending on the components 62, 64 found on the PCB 32, each side wall 40 of an aperture can be more stiff and rigid than the walls of inflatable bladder 10 if no injury to components 62, 64 is likely.

Should a more rigid or inflexible aperture material be chosen, it is contemplated that the apertures will increasingly prevent "ballooning". Ballooning can occur when inflatable bladder 10 is inflated and top wall 12 or top exterior surface 18 of the inflatable bladder unevenly vertically expands with respect to the bottom wall 14 or bottom exterior surface 20. As one example, a portion 44 of inflatable bladder 10 illustrated in FIG. 2 depicts ballooning. The ballooning effect can be more prevalent near the central, unsupported areas of an inflated object (not shown). For example, as a rectangular inflatable bladder 10, as illustrated in FIGS. 1–3, expands due to increasing interior pressure, the inflatable bladder can have a tendency to permit the top exterior and bottom exterior surfaces 18, 20 to bulge outwardly and become hemispherical. However, apertures with their respective side walls, illustrated in FIG. 2, as they are distributed within the inflatable bladder 10, can help prevent ballooning of the inflatable bladder. Thus, apertures can encourage or achieve a more relatively planar top exterior surface 18 for inflatable bladder 10 as opposed to an inflatable bladder without apertures. Although some ballooning can still occur, apertures that are distributed across the top exterior surface 18 of inflatable bladder 10, with their respective side walls, will segment the top exterior surface 18 of the inflatable bladder and reduce the magnitude of the bulging. The amplitude and frequency of peaks and troughs formed by ballooning across the top exterior surface 18 of inflatable bladder 10 can be found to be acceptable when the side walls of apertures maintain top wall 12 of the inflatable bladder in a substantially planar configuration. This result occurs because the aperture side walls 40 reach a limit of expansion as their length increases and the top wall 12 of the inflatable bladder 10 is prevented from expanding further outward.

Figure 6:
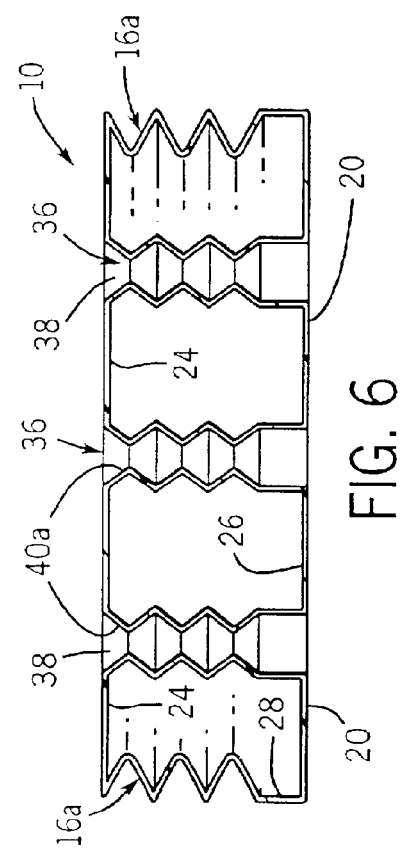
FIG. 6 is a cross-sectional, side elevational view of the inflatable bladder depicted in FIG. 5, taken along line 6—6, illustrating the pleated side walls and pleated apertures.
Figure 10:
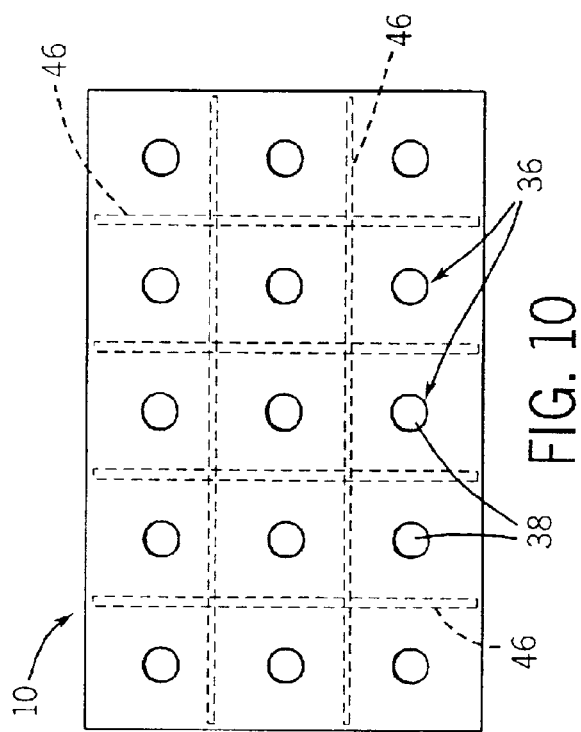
FIG. 10 is a top plan view of another embodiment of an inflatable bladder according to the invention illustrating the inflatable bladder with both apertures and baffles.

In another embodiment of inflatable bladder 10, as illustrated in FIGS. 5 and 6, the plurality of apertures 36 comprise aperture side walls 40a, or a portions thereof, that are pleated, corrugated, or otherwise "accordion-like". By using apertures of this design, the side walls 40a of the apertures 36 are inhibited from constricting when a suction force is introduced into inflatable bladder 10 and transported through the apertures to the top exterior surface 18 of the inflatable bladder. As a suction force is increased and decreased, each aperture can longitudinally expand or compress, respectively, instead of axially constricting. With no ability to longitudinally expand and compress, the suction pressure could become so great as to cause the aperture walls 40 to constrict such that they close the aperture. This would effectively reduce or block entirely the suction pressure being communicated through the aperture. Thus, with the aid of pleated aperture side walls 40a, suction can continue to be transported to the aperture openings 38 even as the suction pressure increases.

Further, a means or mechanism such as a lift table 70 for vertically lifting inflatable bladder 10 may not be required to place the inflatable bladder in contact with the PCB 32. As fluid is introduced into inflatable bladder 10 by supply tube 34, the pleated side walls 16a are permitted to expand, and if the inflatable bladder is in close proximity to the PCB 32, the PCB will be contacted by the expanding inflatable bladder. Conversely, as a fluid is discharged from inflatable bladder 10 by reversing the flow of fluid through supply tube 34, the pleated side walls 16a of the bladder retract and permit vertical constriction of the inflatable bladder. Thus, contact between an inflatable bladder 10 and a PCB 32 can be terminated and the PCB thereafter transported to a subsequent processing step.

Once inflatable bladder 10 is inflated to a desired pressure, the bladder can remain inflated while processing the next PCB in an assembly line. The inflatable bladder can also remain inflated and accept a PCB assembly that possesses an entirely different component configuration. The pliability of inflatable bladder 10 permits universal acceptance of PCB's comprising differing components such that the PCB is securely held to the top exterior surface 18 by suction from the apertures.

In another embodiment, inflatable bladder 10 can be structured to contain one or more baffles 46, as illustrated in FIGS. 7–10. Baffles 46 form an interior wall of material contained within inflatable bladder 10, and can be attached to the top interior surface 24, the bottom interior surface 26, and/or one or more of the side wall interior surfaces 28. In embodiments where baffles are connected to top interior surface 24 and either bottom interior surface 26 or one or more of the side wall interior surfaces 28, the top wall 12 of inflatable bladder 10 can be prevented or inhibited from ballooning and becoming hemispherical when inflatable bladder 10 is inflated. By varying the distribution of baffles 46, effects of top exterior surface ballooning can be reduced. Although some ballooning can still occur, the amplitude and frequency of peaks and troughs across the top exterior surface 18 are reduced such that the inflated bladder 10 more evenly receives PCB 32 thereon.

Figure 11:
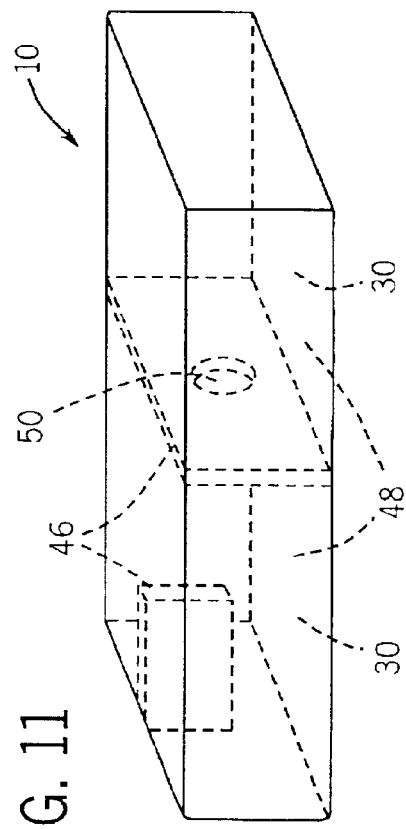
FIG. 11 is a perspective view of another embodiment of an inflatable bladder according to the invention, without apertures, illustrating baffles within the bladder.

By attaching baffles 46 to interior surfaces 24, 26, 28, separate chambers 48 can be created within inflatable bladder 10 as illustrated in FIGS. 7–9 and 11. Respective supply tubes can independently feed these chambers 48, thus allowing the separate chambers to possess distinct pressures within each chamber. This can be especially beneficial where components previously placed on PCB 32 are of different heights or sizes. In another embodiment, baffles 46 within inflatable bladder 10 can comprise an opening 50 or slot, as illustrated in FIG. 11, or other device such as a pneumatic valve or check valve. The opening 50 or other such device can permit negative pressure to traverse baffles and be approximately evenly distributed throughout various chambers 48 in the cavity 30 of the inflatable bladder 10. Thus, an approximately equal pressure can be maintained throughout the cavity 30 despite the presence of baffles 46.

Notably, baffles 46 can be constructed of a material that is the same or different than the material of the inflatable bladder 10. Baffles 46 need not extend entirely across inflatable bladder 10, as illustrated in FIG. 11, and can be fashioned as segments of material that are triangular, rectangular, square, contoured, or otherwise when shaped.

Figure 7:
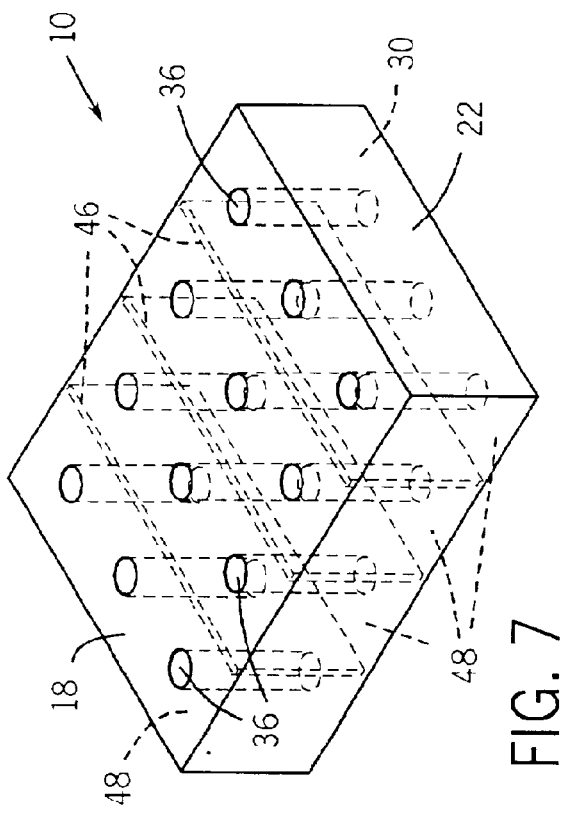
FIG. 7 is a perspective view of an embodiment of the inflatable bladder comprising both apertures and baffles within the bladder.
Figure 9:
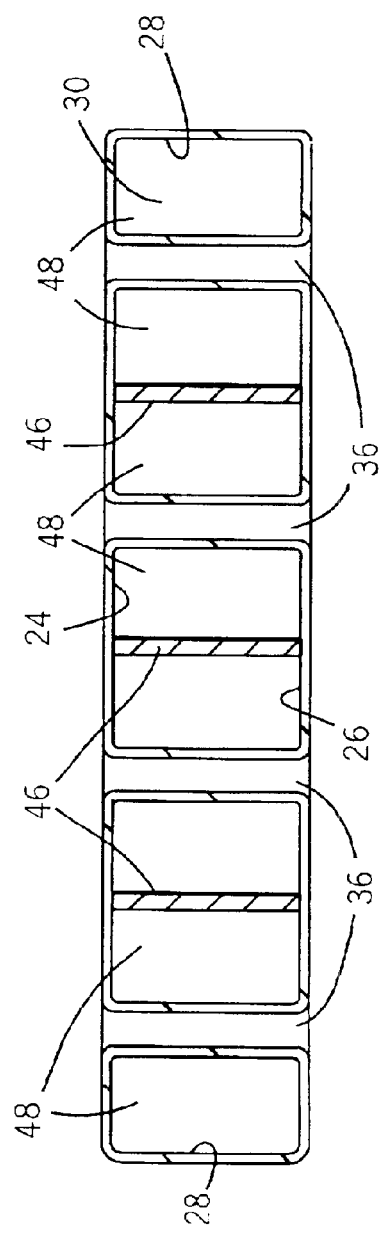
FIG. 9 is a cross-sectional, side elevational view of the inflatable bladder depicted in FIG. 8, taken along line 9—9, further illustrating the apertures and baffles within the bladder.

In another embodiment, the apertures and baffles as described can be used in combination in a single inflatable bladder 10 as illustrated in FIG. 7. The independent functions and benefits of apertures and baffles can, in a single embodiment, be merged and perform in harmony.

Figure 4:
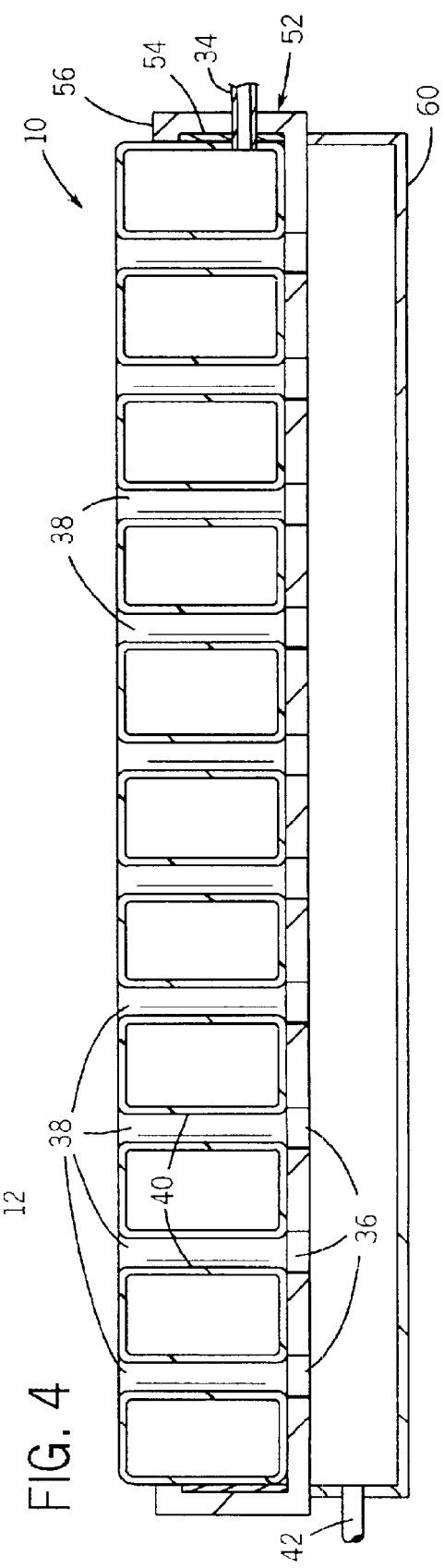
FIG. 4 is a cross-sectional, side elevational view of the fixture apparatus of FIG. 3 taken along line 4—4 illustrating apertures within the inflatable bladder and the suction gallery external to the containment structure.

In another aspect of the invention, inflatable bladder 10 can be disposed within a containment structure 52 to form a fixture apparatus 58 (FIGS. 2–4). To encourage inflatable bladder 10 to remain in containment structure 52 as the inflatable bladder is inflated and deflated, at least a portion of the side walls of the inflatable bladder can be contacted by flange strip 54 as shown in FIGS. 2 and 3. Flange strip 54 can be attached around, or formed as part of, inflatable bladder 10. Inflatable bladder 10 is secured in containment structure 52 by flange strip 54 and lip 56 acting in combination. Lip 56 catches flange strip 54 and thereby holds inflatable bladder 10 within containment structure 52. The bottom wall 14 or bottom exterior surface 20 of inflatable bladder 10 can be secured to containment structure 52.

Depending on the rigidity or stiffness of side walls 16 of inflatable bladder 10, it is contemplated that containment structure 52 may not be necessary for supporting the inflatable bladder 10. This is particularly true where inflatable bladder 10 comprises pleated side walls 16a as illustrated in. FIGS. 5–6. Also, since inflatable bladder 10 is constructed to expand and constrict vertically by virtue of the pleats, both a containment structure 52 and a means for vertical displacement or movement of the inflatable bladder 10 may be unnecessary.

The suction force that exists within apertures 36, as noted above, can be introduced into a suction gallery 60 by using suction tube 42. A "quick connect" or other connecting device known in the art can associate the suction tube 42 with the vacuum source (not shown). The suction tube 42 or tubes can be received by inflatable bladder 10 at any locale, such as one of the side walls 16 as illustrated in FIG. 4, or the bottom wall 14 (not shown). Suction tube 42 can terminate at the entrance of suction gallery 60, or it can extend into the suction gallery. Should it be desired that suction tube 42 extend into suction gallery 60, it can be fragmented to create a series of suction tubes, 42a, 42b, 42c, 42d, 42e, and 42f, as illustrated in FIG. 5. No matter which embodiment is chosen, so long as suction can be communicated from the vacuum source to the opening 38 of individual apertures 36 at the top exterior surface 18 of inflatable bladder 10, the suction tube 42 or tubes can be configured as desired. Although suction is provided by a tube or tubes, other means such as hoses, pipes, conduits, channels, ducts, or the like are contemplated as suitable alternatives for providing suction. The tube or other element should provide sufficient rigidity or other characteristics to inhibit the tube from collapsing as the suction force is introduced.

Suction gallery 60 can be an external attachment to inflatable bladder 10, as illustrated in FIGS. 2 and 4, or the suction gallery can be formed with the inflatable bladder in a solitary unit as depicted in FIG. 5. In another embodiment, suction gallery 60 can also be located within containment structure 52 (not shown), or outside the containment structure as illustrated in FIG. 2

In embodiments employing an internal suction gallery and a series of suction tubes, such as the embodiment of FIG. 5, the series of suction tubes are directly connected to the associated apertures. As such, the bottom exterior surface of inflatable bladder 10 is defined to be the top of the suction gallery or suction tubes. Thus, although the apertures fail to penetrate bottom wall 14 of inflatable bladder 10, they still extend from a top exterior surface to a bottom exterior surface of the inflatable bladder as defined in these embodiments.

Referring to FIG. 2, in use a typical inflatable bladder 10 is inflated courtesy of supply tube 34 and a suction force is introduced into suction gallery 60 and associated apertures 36. When PCB 32 and inflatable bladder 10 come into contact, the inflatable bladder provides support for the PCB while components 62, 64 are being placed on the PCB 32. Further, the suction force translated to aperture openings 38 on the top exterior surface 18 acts to capture the PCB 32 and hold it securely against inflatable bladder 10. Thus, the PCB 32 is upwardly supported by inflatable bladder 10 and pulled or urged downwardly toward the inflatable bladder by suction at the aperture openings 38. In one embodiment, both the support provided by inflatable bladder 10 and the pull provided by the suction force through the apertures 36 is approximately evenly distributed over portions of the PCB 32 in contact with the inflatable bladder. Thus, as component 62, 64 placement occurs, the PCB 32 is retained without injuring components 62, 64 in contact with the top wall 12 and the PCB is inhibited from bowing, flexing or bending away from contact with the top exterior surface 18 of the inflatable bladder.

As illustrated in FIG. 2, an inflatable bladder 10, as part of fixture apparatus 58 including an external gallery 60, is shown in operation in a characteristic embodiment. FIG. 2 depicts a partially cut-away elevational view of an inflatable bladder 10 and associated components 62, 64 as the inflatable bladder 10 supports PCB 32 during component 62, 64 placement on the PCB. As shown in FIG. 2, PCB 32 can include top side components 62 and back side components 64. These components 62, 64 can comprise a variety of electrical structures or parts known in the art to be placed on semiconductor substrates. One particular top side component, component 66, is shown in FIG. 2 being placed on PCB 32 by placement head 68. Placement head 68 is mounted on manipulator arm 70, and in turn, manipulator arm is connected to a conventional, automated placement system such as is well known in the art. Because PCB's have some flexibility, as component placement occurs, PCB 32 can have a tendency to flex, bow, or bend. However, in locations where back side components 64 are mounted on PCB 32, inflatable bladder 10 easily conforms to the component shapes and supports the PCB. As such, damage to PCB 32 and components 62, 64 is avoided while support for the PC continues.

Figure 13:
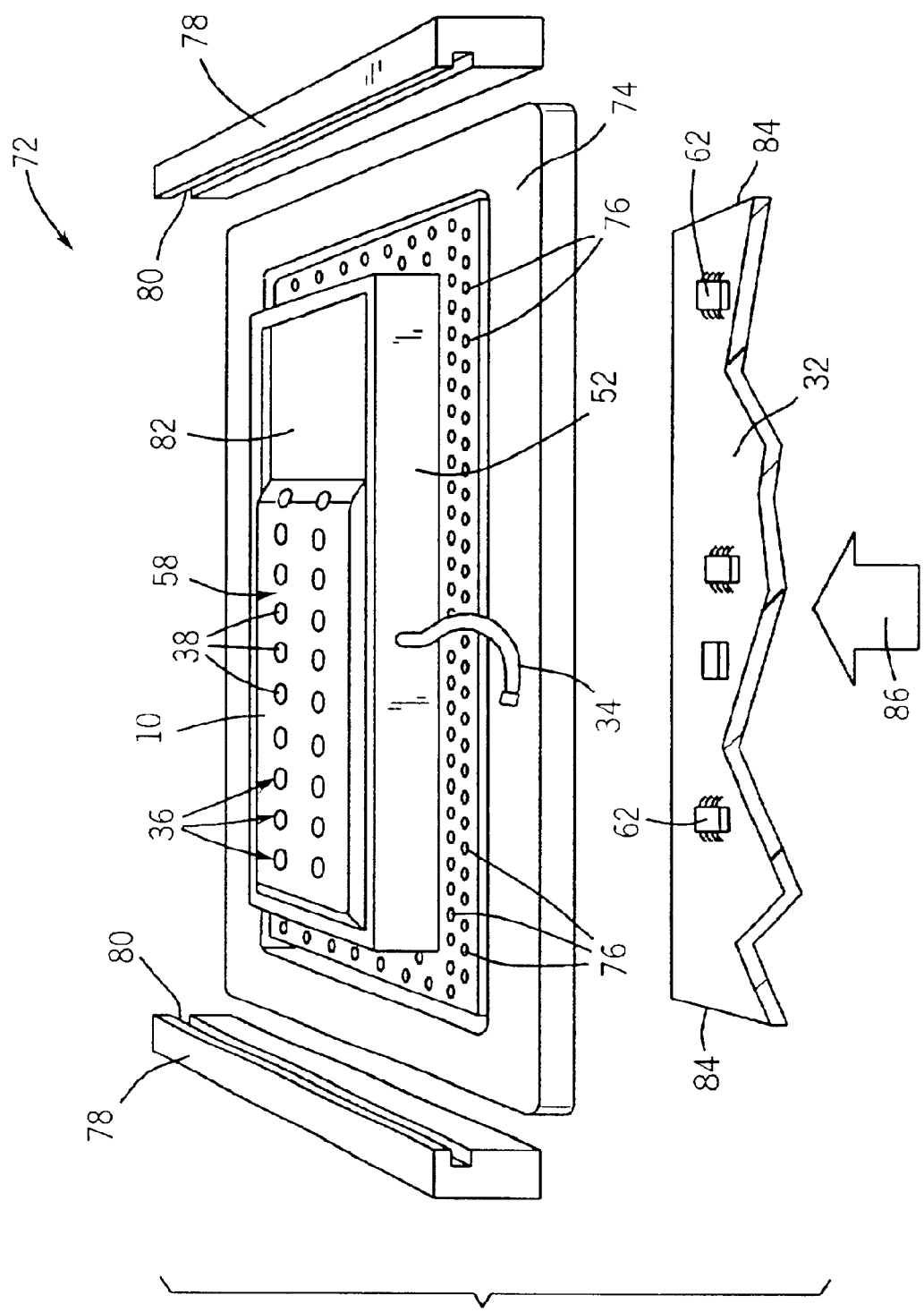
FIG. 13 is a front perspective (partial section) view of an embodiment of a system according to the invention illustrating the fixture apparatus of FIG. 1 as opposing edges of a semiconductor substrate are introduced into the slots located within a pair of rails in a railed assembly.

As illustrated by the system shown in FIG. 13, inflatable bladder 10 and containment structure 52 (i.e. the fixture apparatus 58) are shown in association with a railed assembly 72. As depicted, railed assembly 72 comprises rails 78 and lift table 74. Containment structure 52 can be secured to lift table 74, otherwise known as a base plate, by any conventional means. For example, pins can be attached to the bottom of containment structure 52, and subsequently inserted into lift table holes 76 contained within the lift table, or the containment structure can be directly secured to the lift table by any conventional means. Railed assembly 72 can be any conventional railed assembly known in the art for PCB assembly, and more specifically for PCB component placement purposes. In one embodiment, railed assembly 72 comprises rails 78, slots 80, and lift table 74 as well as fixture apparatus 58. Each rail 78 in the pair of rails includes a slot 80 for receiving and retaining PCB 32 during component 62, 64 placement. Typically, the edges 84 of PCB 32 are placed in slots 80 above lift table 74 to hold the PCB for assembly after the PCB is slid or maneuvered into place in the rails. As PCB 32 is, for example, slid forward as indicated by the directional arrow 86 in FIG. 13, a fixture apparatus 58 according to the invention, which is disposed on lift table 74 becomes positioned below the PCB.

Although an acceptable length dimension of inflatable bladder 10 is substantially similar to a length of PCB 32, the length can be easily smaller or larger than the length of the PCB and still provide support. In the example illustrated in FIG. 13, a substantially coextensive inflatable bladder 10 is slightly smaller in width than PCB 32 to allow inflatable bladder 10 to fit within rail assembly 72. Where the edges of PCB 32 are already solidly supported, such as in a conventional rail system, it is not detrimental for inflatable bladder 10 to be substantially smaller than the PCB. Although inflatable bladder 10 is shown as being used in this particular railed assembly configuration, the inflatable bladder could also be used for supporting other semiconductor substrates in different assembly configurations.

FIG. 13 also shows an embodiment of containment structure 52 wherein adjustable cover plate 82 is placed over a portion of inflatable bladder 10 in the containment structure. Adjustable cover plate 82 can be used to confine a portion of inflatable bladder 10 within containment structure 52 such that the inflated surface area of inflatable bladder 10 is selectively reduced to a smaller area. This feature allows inflatable bladder 10 to be adjustably confined within containment structure 52 to easily adapt to different sized circuit boards. Specifically, if a PCB 32 has a length shorter than inflatable bladder 10, and is positioned for assembly, adjustable cover plate 82 can be used to keep inflatable bladder 10 from protruding upwardly near the edge of the circuit board. Thus, potential injury, manufacturing disruption, or damage to the inflatable bladder can be avoided. Accordingly, cover plate 82 is adjustable relative to containment structure 52, and can comprise a variety of conventional plates capable of retaining inflatable bladder 10 within the containment structure. For example, adjustable cover plate 82 can be a metal plate having a lip feature (not shown) for interlocking with containment structure 52.

As described and illustrated, the adaptability of the fixture apparatus 58 with the included inflatable bladder 10 has been demonstrated. Both the inflatable bladder 10 and the fixture apparatus 58 can conform to existing assembly equipment and provide an easy-to-use means for setting-up assembly operations. Further, inflatable bladder 10 can conform to a plurality of component configurations found on a PCB, provide support for a PCB, and secure a PCB to the inflatable bladder.

In compliance with applicable statutes, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A support for a semiconductor substrate, comprising:
   an inflatable bladder comprising a top exterior surface, a bottom exterior surface, and at least one aperture disposed within the inflatable bladder and extending from the top exterior surface to the bottom exterior surface; and
   a member for providing suction through the at least one aperture.

2. The support of claim 1, wherein the inflatable bladder further comprises pleated or corrugated side walls.

3. The support of claim 1, wherein the at least one aperture comprises pleated or corrugated side walls.

4. The support of claim 1, wherein the suction providing member comprises a vacuum device.

5. The support of claim 1, wherein upon providing suction through the at east one aperture, a substrate disposed on the top or bottom exterior surface is urged into contact with the bladder.

6. The support of claim 5, wherein the side walls of the at least one aperture longitudinally compress as the substrate is urged into contact with the bladder.

7. The support of claim 5, wherein the substrate comprises a printed circuit board.

8. The support of claim 1, wherein each of the inflatable bladder and the at least one aperture comprise pleated or corrugated side walls.

9. The support of claim 1, wherein side walls of the at least one aperture disposed within the inflatable bladder and the inflatable bladder comprise different materials.

10. The support of claim 1, wherein the inflatable bladder is inflated with a fluid selected from a group consisting of air, water, nitrogen, and oil.

11. A support for a semiconductor substrate, comprising:
    an inflatable bladder comprising a top exterior surface, a bottom exterior surface, and a plurality of apertures disposed within the inflatable bladder and extending from the top exterior surface to the bottom exterior surface; and
    a member for providing suction through the plurality of apertures.

12. The support of claim 11, wherein each of the apertures comprise a length, and one or more apertures comprise a diameter that varies over said length.

13. The support of claim 11, wherein at least one aperture comprises a length that is different than another aperture in the plurality of apertures.

14. The support of claim 11 wherein the plurality of apertures define individual aperture openings that are symmetrically disposed across the top or bottom exterior surface of the bladder.

15. The support of claim 11, wherein one or more apertures in the plurality of apertures converge into a common aperture opening.

16. The support of claim 11, wherein a longitudinal axis of at least one aperture is angled with respect to the top or bottom exterior surface of the bladder.

17. A support for a semiconductor substrate, comprising:
    an inflatable bladder comprising a top interior surface, a bottom interior surface, opposing side walls and at least one baffle disposed within the inflatable bladder.

18. The support of claim 17, wherein the at least one baffle is secured to the top interior surface and the bottom interior surface of the inflatable bladder.

19. The support of claim 17, wherein the at least one baffle is secured to the top interior surface and one of the side walls.

20. The support of claim 17, wherein the at least one baffle is secured to one of the top and bottom interior surfaces and the side walls.

21. The support of claim 17, wherein the at least one baffle is secured to the top interior surface, the bottom interior surface, and at least one of the side walls.

22. A support for a semiconductor substrate, comprising:
    an inflatable bladder comprising a top surface, a bottom surface, opposing side walls, a cavity, at least one aperture disposed within the cavity and extending from the top surface to the bottom surface, and at least one baffle disposed within the cavity; and
    a member for providing suction through the at least one aperture.

23. The support of claims 22, wherein the at least one aperture disposed within the inflatable bladder comprises side walls that are pleated or corrugated.

24. The support of claim 22, wherein the suction providing member is operable to provide suction through the at least one aperture such that the semiconductor substrate, when disposed on the top or bottom surface of the bladder, is urged into contact with and inhibited from flexing, bowing, or bending.

25. The support of claim 24, wherein side walls of the at least one aperture are longitudinally compressed as the suction is provided and the semiconductor substrate is urged into contact with the inflatable bladder.

26. The support of claim 22, wherein the at least one baffle is secured to the top surface and the bottom surface of the inflatable bladder, and is functional to inhibit the semiconductor substrate, when disposed on the top or bottom surface of the bladder, from flexing, bowing, or bending.

27. The support of claim 22, wherein the at least one baffle is secured to the top or bottom surface and one of the side walls of the inflatable bladder, and structured to inhibit the semiconductor substrate from flexing, bowing, or bending when disposed on the top or bottom surface of the bladder.

28. The support of claim 22, wherein the at least one baffle is secured to the top or bottom surface and each of the side walls of the inflatable bladder, and structured to inhibit the semiconductor substrate from flexing, bowing, or when disposed on the top or bottom surface of the bladder.

29. The support of claim 22, wherein the at least one baffle is secured to the top surface, the bottom surface, and at least one of the side walls of the inflatable bladder, and structured to inhibit the semiconductor substrate from flexing, bowing, or bending when disposed on the top or bottom surface of the inflatable bladder.

30. The support of claim 22, wherein the inflatable bladder comprises a pliable material.

31. The support of claim 22, wherein the inflatable bladder and the at least one baffle are constructed of a same material.

32. The support of claim 22, wherein the inflatable bladder comprises a material selected from a group consisting of polyurethane, vinyl, carbon impregnated vinyl, and rubber.

33. The support of claim 22, wherein the inflatable bladder is coated with a material selected from a group consisting of polyurethane, vinyl, carbon impregnated vinyl, and rubber.

34. The support of claim 22, wherein at least a portion of the inflatable bladder comprises a material having a thickness of about 0.03 to about 0.05 inch.

35. The support of claim 22, wherein the inflatable bladder comprises a material having a thickness sufficient to support the semiconductor substrate thereon when the bladder is inflated and a component is placed on the semiconductor substrate.

36. The support of claim 22, wherein the at least one baffle within the inflatable bladder divides the cavity into two or more chambers.

37. The support of claim 36, wherein each of the two or more chambers are connected to a fluid supply tube.

38. The support of claim 36, wherein the at least one baffle is structured to allow movement of a fluid between the two or more chambers such that each chamber comprises an approximately equal interior pressure.

39. An apparatus for supporting a semiconductor substrate, comprising:
   an inflatable bladder comprising a top surface, a bottom surface, and at least one aperture disposed within the inflatable bladder and extending from the top surface to the bottom surface;
   a member for providing suction through at least one aperture; and
   a container retaining the inflatable bladder therein.

40. The apparatus of claim 39, wherein the container comprises a flange and a lip for engaging the flange to secure the inflatable bladder within the container.

41. The apparatus of claim 39, wherein the container further comprises a cover plate for covering a portion of the inflatable bladder and reducing an area of the top or bottom surface of the inflatable bladder for contacting the semiconductor substrate.

42. The apparatus of claim 39, wherein the inflatable bladder is inflated.

43. The apparatus of claim 39, wherein the inflatable bladder is deflated.

44. An apparatus for supporting a semiconductor substrate, comprising:
   an inflatable bladder comprising a top surface, a bottom surface, opposing side walls, a cavity, at least one aperture disposed within the cavity and extending from the top surface to the bottom surface, and at least one baffle disposed within the cavity;
   a member for producing suction through the at least one aperture; and
   a containment structure retaining the inflatable bladder therein.

45. The apparatus of claim 44, wherein upon providing suction force through the at least one aperture, a semiconductor substrate disposed on the top or bottom surface of the bladder is urged onto said top or bottom surface.

46. The apparatus of claim 45, wherein the semiconductor substrate is inhibited from flexing, bowing, or bending away from the top or bottom surface of the inflatable bladder.

47. The apparatus of claim 44, wherein the at least one baffle inhibits a semiconductor disposed on the top or bottom surface of the bladder from flexing, bowing, or bending.

48. An apparatus for supporting a semiconductor substrate, comprising:
   an inflatable bladder comprising a top surface, a bottom surface, and at least one aperture disposed within the inflatable bladder and extending from the top surface to the bottom surface;
   a containment structure retaining the inflatable bladder therein;
   a member for providing suction through the at least one aperture; and
   a pair of rails, each rail containing a slot configured to slidably receive an edge of the semiconductor substrate therein.

49. An apparatus for supporting a semiconductor substrate, comprising:
   an inflatable bladder comprising a top surface, a bottom surface, side walls and at least one baffle disposed within the inflatable bladder;
   a containment structure retaining the inflatable bladder therein; and
   a pair of rails, each rail containing a slot configured to slidably receive an opposing edge of the semiconductor substrate therein.

50. A fixture apparatus for supporting a semiconductor substrate, comprising:
   an inflatable bladder comprising a top surface, a bottom surface, side walls, at least one aperture disposed within the inflatable bladder and extending from the top surface to the bottom surface, and at least one baffle disposed within the inflatable bladder;

a containment structure retaining the inflatable bladder therein;

a member for providing suction through at least one aperture; and a pair of rails, each rail containing a slot configured to receive an opposing edge of the semiconductor substrate therein.

51. A support for a semiconductor substrate, comprising:

an inflatable bladder comprising opposing top and bottom surfaces, opposing side walls, a cavity, and one or more baffles disposed within the cavity of the bladder.

52. The support of claim 51, wherein at least one baffle is connected to each of the opposing surfaces.

53. The support of claim 51, wherein the one or more baffles comprises means for passage of fluid therethrough.

54. The support of claim 53, wherein the passage means comprises an aperture.

55. The support of claim 53, wherein the passage means comprises a check valve.

56. The support of claim 51, further comprising means for supplying fluid into the bladder.

57. A support for a semiconductor substrate, comprising:

an inflatable bladder comprising opposing top and bottom surfaces, opposing side walls, a cavity, and at least one aperture disposed within the cavity and opening to the top surface; and means for providing suction through the at least one aperture.

58. The support of claim 57, wherein the suction providing means comprises a vacuum device.

59. The support of claim 57, wherein the bladder comprises a plurality of apertures.

60. The support of claim 57, further comprising a suction gallery attached to the bladder.

61. The support of claim 60, wherein the suction gallery comprises an external attachment to the bladder.

62. The support of claim 60, wherein the suction gallery is formed within the inflatable bladder.

63. The support of claim 58, wherein the side walls of the bladder are pleated.

64. A support for a semiconductor substrate, comprising:

an inflatable bladder comprising opposing top and bottom surfaces and opposing side walls that define a cavity and at least one baffle disposed within the cavity; and means for introducing a fluid into the cavity to inflate the bladder.

65. The support of claim 64, wherein the fluid introducing means is selected from a group consisting of a tube, hose, pipe, conduit, channel, and duct.

66. The support of claim 64, wherein the fluid introducing means comprises a tube adapted for connection to a fluid supply.

67. The support of claim 64, wherein the bladder further comprises a fluid contained within the cavity.

68. The support of claim 67, wherein the fluid comprises a liquid.

69. The support of claim 68, wherein the fluid comprises water.

70. The support of claim 67, wherein the fluid comprises a gas.

71. The support of claim 70, wherein the fluid comprises air.

72. An apparatus for supporting a semiconductor substrate, comprising:

an inflatable bladder comprising a top surface, a bottom surface, and at least one aperture disposed within the bladder with an opening on the top or bottom surface;

means for providing suction through the at least one aperture; and a container having the bladder disposed therein.

73. The apparatus of claim 72, wherein the suction providing means comprises a vacuum device.

74. The apparatus of claim 72, wherein the bladder further comprises a flange engageable with a structure on the container to retain the bladder within the container.

75. The apparatus of claim 74, wherein the structure on the container comprises a lip.

76. An apparatus for supporting a semiconductor substrate, comprising:

an inflatable bladder comprising opposing surfaces, opposing side walls, a cavity, and at least one aperture disposed within the cavity and opening to the opposing surfaces;

a containment structure retaining the inflatable bladder therein; and a pair of opposing rails secured to the containment structure, each rail comprising a slot configured to slidably receive an edge of the semiconductor substrate therein.

77. A support for a semiconductor substrate, comprising:

an inflatable bladder comprising a top surface, a bottom surface, a cavity and at least one aperture disposed within the inflatable bladder and opening to at least the top surface;

means for introducing fluid into the cavity of the bladder; and means for providing suction through the at least one aperture of the bladder to urge the semiconductor substrate into contact with the top or bottom surface of the bladder.

78. The support of claim 77, wherein the fluid introducing means is selected from a group consisting of a tube, hose, pipe, conduit, channel, and duct.

79. The support of claim 77, wherein the fluid introducing means comprises a tube adapted for connection to a fluid supply.

80. The support of claim 77, wherein the suction providing means comprises a tube connected to the aperture and to a vacuum device.

* * * * *

UNITED STATES PATENT AND TRADEMARK OFFICE
CERTIFICATE OF CORRECTION

PATENT NO. : 6,857,627 B2
DATED : February 22, 2005
INVENTOR(S) : Brian F. Gordon It is certified that error appears in the above-identified patent and that said Letters Patent is hereby corrected as shown below:

Column 12,
Line 65, replace "claims" with -- claim --.

Signed and Sealed this

Twenty-sixth Day of July, 2005

JON W. DUDAS
*Director of the United States Patent and Trademark Office*